(12) United States Patent
Park et al.

(10) Patent No.: US 7,863,813 B2
(45) Date of Patent: Jan. 4, 2011

(54) INORGANIC ELECTROLUMINESCENCE DEVICE USING QUANTUM DOTS

(75) Inventors: Shang-hyeun Park, Yongin-si (KR); Byoung-lyong Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 395 days.

(21) Appl. No.: 12/010,869

(22) Filed: Jan. 30, 2008

(65) Prior Publication Data
US 2008/0224596 A1   Sep. 18, 2008

(30) Foreign Application Priority Data
Mar. 15, 2007   (KR) ...................... 10-2007-0025637

(51) Int. Cl.
*H05B 33/00* (2006.01)
(52) U.S. Cl. .................. 313/506; 313/502; 345/70; 345/77

(58) Field of Classification Search ............... None
See application file for complete search history.

(56) References Cited

U.S. PATENT DOCUMENTS

| | | | | |
|---|---|---|---|---|
| 2007/0241662 A1* | 10/2007 | Choi et al. | ................ | 313/502 |
| 2008/0218068 A1* | 9/2008 | Cok | ................ | 313/505 |
| 2008/0291140 A1* | 11/2008 | Kent et al. | ................ | 345/83 |

* cited by examiner

*Primary Examiner*—Ashok Patel
(74) *Attorney, Agent, or Firm*—Cantor Colburn LLP

(57) ABSTRACT

An inorganic electroluminescence device including: a substrate; a first electrode formed on the substrate; an inorganic light emitting layer layer formed on the first electrode; a dielectric layer formed on the inorganic light emitting layer; a second electrode formed on the dielectric layer; and a quantun dot layer that is formed between the first electrode and the inorganic light emitting layer and emits light by being excited by visible light emitted from the inorganic light emitting layer.

25 Claims, 3 Drawing Sheets

INORGANIC ELECTROLUMINESCENCE DEVICE USING QUANTUM DOTS

CLAIM OF PRIORITY

This application makes reference to, incorporates the same herein, and claims all benefits accruing under 35 U.S.C. §119 from an application for INORGANIC ELECTROLUMINESCENCE DEVICE USING QUANTUM DOTS earlier filed in the Korean Intellectual Property Office on 15 Mar. 2007 and there duly assigned Serial No. 10-2007-0025637.

BACKGROUND OF THE INVENTION

1. Field of the Invention

The present invention relates to an electroluminescence device, and more particularly, to an inorganic electroluminescence device having improved color purity.

2. Description of the Related Art

A conventional inorganic electroluminescence device has a substrate, a first electrode, an inorganic light emitting layer formed of red phosphors, green phosphors and blue phosphors formed on the first electrode, a dielectric layer and a second electrode sequentially stacked on the inorganic light emitting layer.

In the above described inorganic electroluminescence device, when an alternating voltage is applied between the first and second electrodes, electrons are emitted from the dielectric layer, and the emitted electrons are accelerated by an electric field formed in the inorganic light emitting layer 14 to collide with the red phosphors, green phosphors and blue phosphors in the inorganic light emitting layer. Accordingly, predetermined colors, for example, red, green, and blue visible lights are emitted from red phosphors, green phosphors and blue phosphors respectively to form images.

However, the above described inorganic electroluminescence device has low color purity and thus cannot realize accurate colors, and has problems in realizing a variety of colors. Thus the above described inorganic electroluminescence device is used as a backlight unit of a key pad for mobile phones or various advertising boards.

SUMMARY OF THE INVENTION

It is therefore, one object of the present invention to provide an inorganic electroluminesence device which improves the purity of color and solve the problems in realizing a variety of colors.

It is another object of the present invention to provide an inorganic electroluminescence device that has improved color purity and realizes a variety of colors.

According to an aspect of the present invention, the provided organic electroluminescence device comprises: a substrate; a first electrode formed on the substrate; an inorganic light emitting layer formed on the first electrode; a dielectric layer formed on the inorganic light emitting layer; a second electrode formed on the dielectric layer; and a quantum dot layer that is formed between the first electrode and the inorganic light emitting layer and emits light by being excited by visible light emitted from the inorganic light emitting layer.

Visible light emitted from the quantum dot layer may have higher color purity than the visible light emitted from the inorganic light emitting layer.

The inorganic light emitting layer may be formed of red phosphors, green phosphors, and blue phosphors, and the quantum dot layer is formed of red quantum dots, green quantum dots, and blue quantum dots. The quantum dots may emit light by being excited by visible light in the wavelength range of 400 nm-630 nm.

Red, green, and blue phosphors may be formed to respectively correspond to red, green, and blue quantum dots. The red phosphors may be formed to correspond to the green and blue quantum dots, and the green phosphors may be formed to correspond to the red and blue quantum dots, and the blue phosphors may be formed to correspond to the red and green quantum dots.

The red phosphors maybe formed of ZnS:Cu,Cl,Mn, the green phosphors maybe formed of ZnS:Cu,Al, and the blue phosphors may be formed of ZnS:Cu,Cl. The quantum dots may be formed of CdSe/ZnS.

The quantum dots may emit different colors of visible lights according to the size of the quantum dots. The quantum dots may have a size of 1 nm to 100 nm.

The substrate may be a transparent glass substrate or a plastic substrate. The first electrode may be formed of a transparent conductive material. The second electrode may be formed of a transparent conductive material or a metal.

An alternating voltage maybe applied between the first electrode and the second electrode.

According to another aspect of the present invention, there is provided an inorganic electroluminescence device comprising: a substrate; a first electrode formed on a top surface of the substrate; an inorganic light emitting layer formed on the first electrode; a dielectric layer formed on the inorganic light emitting layer; a second electrode formed on the dielectric layer; and a quantum dot layer that is formed under the substrate and emits light by being excited by visible light emitted from the inorganic light emitting layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
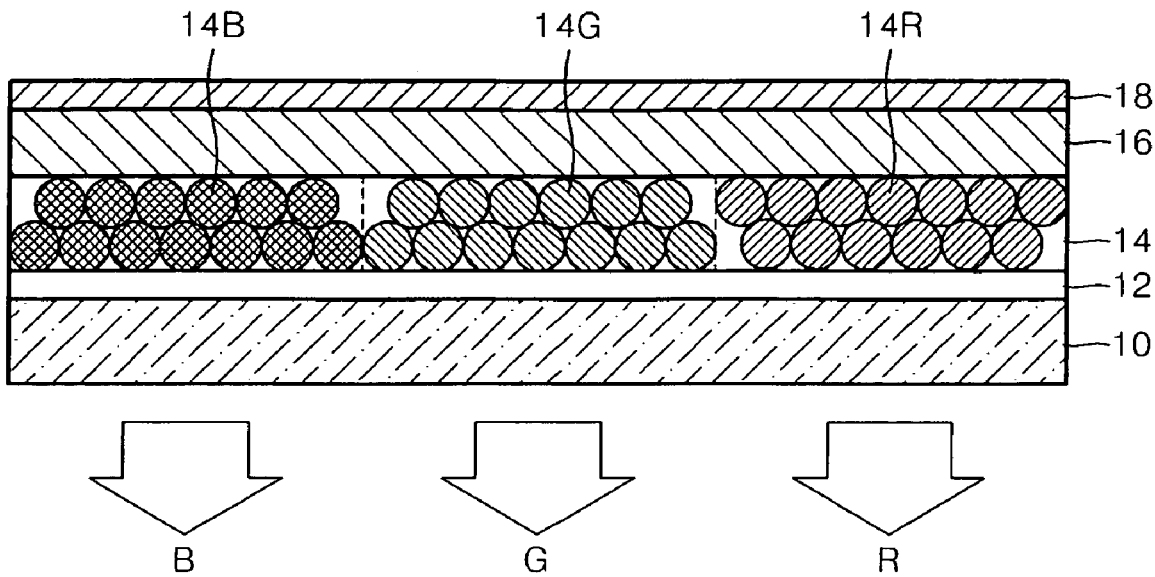
FIG. 1 is a cross-sectional view of a conventional inorganic electroluminescence device.

Turning now to the drawings, FIG. 1 is a cross-sectional view of a conventional inorganic electroluminescence device. Referring to FIG. 1, a first electrode 12 is formed on a substrate 10, and an inorganic light emitting layer 14 formed of red phosphors 14R, green phosphors 14G, and blue phosphors 14B is formed on the first electrode 12. A dielectric layer 16 and a second electrode 18 are sequentially stacked on inorganic light emitting layer 14.

In the above described inorganic electroluminescence device, when an alternating voltage is applied between first electrode 12 and second electrode 18, electrons are emitted from dielectric layer 16, and the emitted electrons are accelerated by an electric field formed in inorganic light emitting layer 14 so as to collide with the phosphors 14R, 14G, and 14B in inorganic light emitting layer 14. Accordingly, predetermined colors, for example, red (R), green (G), and blue (B) visible light are emitted from each of phosphors 14R, 14G, and 14B to form images.

However, the above described inorganic electroluminescence device has low color purity and thus cannot realize accurate colors, and has problems in realizing a variety of colors. Thus the above described inorganic electroluminescence device is used as a backlight unit of a key pad for mobile phones or various advertising boards.

The present invention will now be described more fully with reference to the accompanying drawings, in which exemplary embodiments of the invention are shown.

Figure 2:
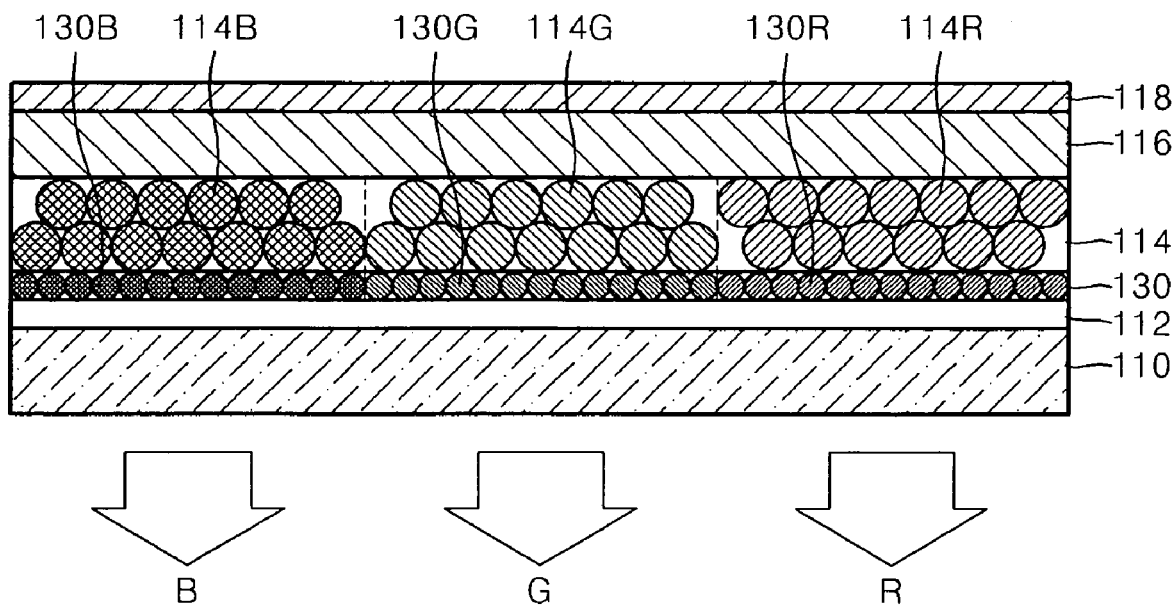
FIG. 2 is a cross-sectional view of an inorganic electroluminescence device according to an embodiment of the present invention.

FIG. 2 is a cross-sectional view of an inorganic electroluminescence device according to an embodiment of the present invention. Referring to FIG. 2, the inorganic electroluminescence device according to the current embodiment of the present invention includes a first electrode 112, a quantum dot layer 130, an inorganic light emitting layer 114, a dielectric layer 116, and a second electrode 118 sequentially stacked on a substrate 110. Substrate 110 is a transparent substrate, and may be a glass substrate or a plastic substrate. A first electrode 112 is formed on a top surface of substrate 110. First electrode 112 may be formed of a transparent conductive material, for example, of an indium tin oxide (ITO).

A quantum dot layer 130 is formed on a top surface of first electrode 112. Quantum dots layer 130 is excited by visible light emitted from inorganic light emitting layer 114 and thus emits visible light having a predetermined color. Quantum dot layer 130 may be formed of red quantum dots 130R emitting red light R, green quantum dots 130G emitting green light G, and blue quantum dots 130B emitting blue light B. Quantum dots 130R, 130G, and 130B may emit light by being excited by visible light having wavelengths in the range of about 400 nm to 639 nm. Quantum dots 130R, 130G, and 130B may have a size of approximately 1 nm to 100 nm. Quantum dots 130R, 130G, and 130B can emit visible light having different colors according to the size thereof. For example, quantum dots 130R, 130G, and 130B may be formed of CdSe/ZnS, but are not limited thereto, and quantum dots 130R, 130G, and 130B maybe formed of other various materials. Since quantum dots 130R, 130G, and 130B emit visible light having excellent color purity, visible light R, G, and B emitted from quantum dots 130R, 130G, and 130B may have improved color purity with respect to visible light emitted from inorganic light emitting layer 114.

Inorganic light emitting layer 114 is formed on quantum dots layer 130. Inorganic light emitting layer 114 emits visible light as electrons accelerated by an electric field formed in inorganic light emitting layer 114 collide with phosphors 114R, 114G, and 114B in inorganic light emitting layer 114. Inorganic light emitting layer 114 may be formed of red phosphors 1 14R emitting red light, green phosphors 114G emitting green light, and blue phosphors 114B emitting blue light. In detail, red phosphors 114R maybe formed of ZnS: Cu,Cl,Mn, green phosphors 114G may be formed of ZnS:Cu, Al, and blue phosphors 114B maybe formed of ZnS:Cu,Cl. Phosphors 114R, 114G, and 114B may also be formed other various materials. Red phosphors 114R, green phosphors 114G, and blue phosphors 114B may be formed to correspond to red quantum dots 130R, green quantum dots 130 G, the blue quantum dots 130B, respectively.

Dielectric layer 116 is formed on inorganic light emitting layer 114, and dielectric layer 116 may be formed of, for example, silicon oxide. Second electrode 118 is formed on dielectric layer 116. Second electrode 118 may be formed of a metal such as silver (Ag) or a transparent conductive material such as indium tin oxide (ITO).

In the inorganic electroluminescence device according to the current embodiment, when a predetermined voltage is applied between first electrode 112 and second electrode 118, electrons are emitted from dielectric layer 116 into inorganic light emitting layer 114. Here, an alternating current may be applied between first electrode 12 and second electrode 118. However, the present invention is not limited to the alternating current, and a direct current may also be applied between first electrode 112 and second electrode 118. Next, the electrons emitted from dielectric layer 116 are accelerated in the electric field formed in inorganic light emitting layer 114 and collide with red phosphors 114R, green phosphors 114G, and blue phosphors 114B inside inorganic light emitting layer 114. Accordingly, red light, green light, and blue light are emitted from red phosphors 114R, the green phosphors 114G, and blue phosphors 114B, respectively. The emitted red light, green light, and blue light excite red quantum dots 130R, green quantum dots 130 G, and blue quantum dots 130B, respectively. Thus red light R, green light G, and blue light B having high color purity are emitted from red quantum dots 130R, green quantum dots 130 G, and blue quantum dots 130B, respectively. Emitted visible light R, G, and B pass through first electrode 112 and substrate 110 to be emitted out of the device, thereby forming an image. The inorganic electroluminescence device according to the current embodiment of the present invention can realize accurate color images by using quantum dots emitting visible light having high color purity.

According to the current embodiment, red phosphors 114R, green phosphors 114G, and blue phosphors 114B correspond to red quantum dots 130R, green quantum dots 130 G, and blue quantum dots 130B, respectively. However, it is not limited thereto, and red phosphors 114R, green phosphors 114G, and blue phosphors 114B may correspond to red quantum dots 130R, green quantum dots 130 G, and blue quantum dots 130B in various ways. For example, red phosphors 114R may correspond to green quantum dots 130G or blue quantum dots 130B. Green phosphors 114G may correspond to red quantum dots 130R or blue quantum dots 130B, and blue phosphors 114B may correspond to red quantum dots 130R or green quantum dots 130G.

Figure 3:
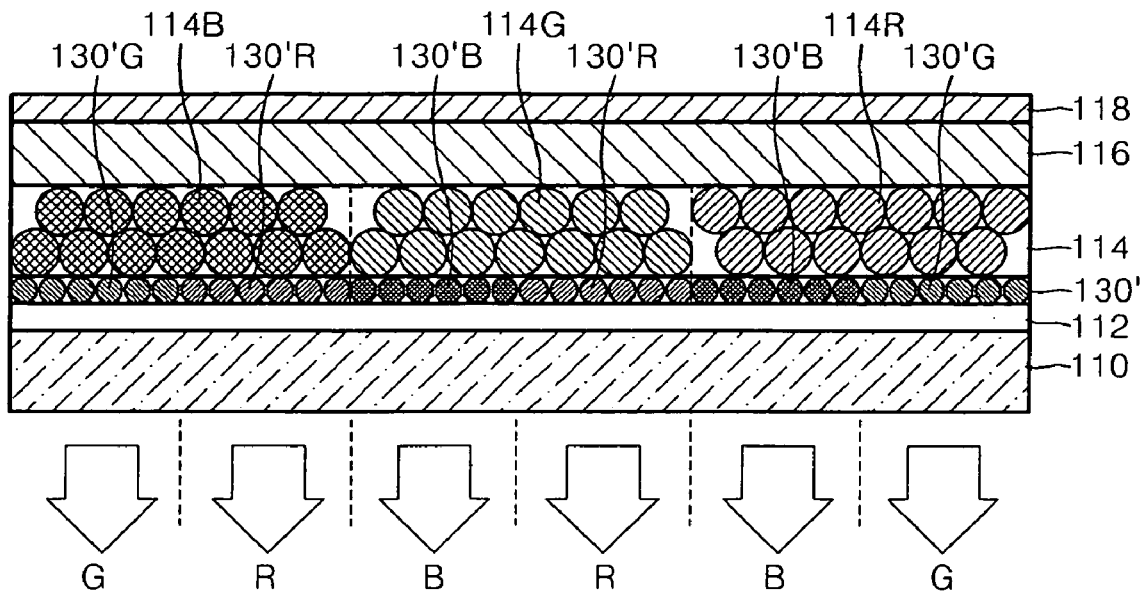
FIG. 3 is a cross-sectional view of a modified example of the inorganic electroluminescence device of FIG. 2.

FIG. 3 is a cross-sectional view of a modified example of the inorganic electroluminescence device of FIG. 2. Referring to FIG. 3, unlike FIG. 2, two color types of quantum dots correspond to each color type of phosphor. In detail, green quantum dots 130'G and blue quantum dots 130'B correspond to red phosphors 114R; red quantum dots 130'R and blue quantum dots 130'B correspond to green phosphors 114G; and red quantum dots 130'R and green quantum dots 130'G correspond to blue phosphors 114B.

In the above described inorganic electroluminescence device, green quantum dots 130'G and blue quantum dots 130'B are excited by red light emitted from red phosphors 114R, and thus green light G and blue light B having high color purity are emitted. Also, red quantum dots 130'R and blue quantum dots 130'B are excited by green light emitted from green phosphors 114G, and thus red light R and blue light B having high color purity are emitted. Also, red quantum dots 130'R and green quantum dots 130'G are excited by blue light emitted from blue phosphors 114B, and thus red light R and green light G having high color purity are emitted.

Besides the above example, two color types of quantum dots may correspond to each color type of phosphor in a variety of other ways. Also, three or more color types of quantum dots may correspond to one color type of phosphor.

Figure 4:
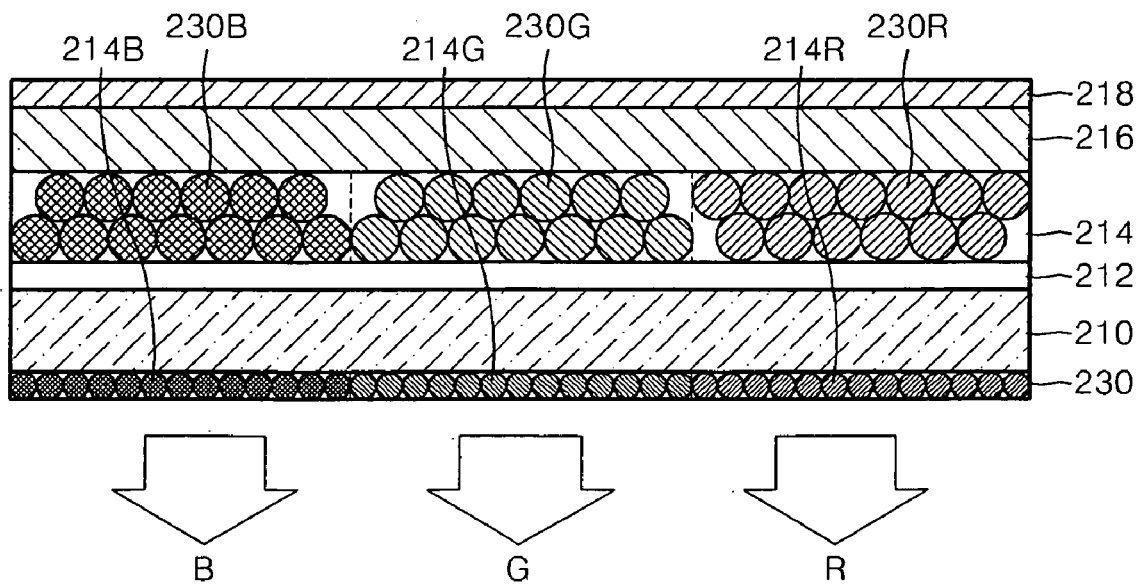
FIG. 4 is a cross-sectional view of an inorganic electroluminescence device according to another embodiment of the present invention.

FIG. 4 is a cross-sectional view of an inorganic electroluminescence device according to another embodiment of the present invention. Hereinafter, differences from the embodiments described above will be described. Referring to FIG. 4, a first electrode 212, an inorganic light emitting layer 214, a dielectric layer 216, and a second electrode 218 are sequentially formed on a substrate 210, and a quantum dot layer 230 is formed under substrate 210. Substrate 210 is transparent, and may be a glass substrate or a plastic substrate. First electrode 212 is formed on substrate 210, and first electrode 212 may be formed of a transparent conductive material such as ITO.

Inorganic light emitting layer 214 is formed on first electrode 212. Inorganic light emitting layer 214 may be formed of red phosphors 214R emitting red light, green phosphors 214G emitting green light, and blue phosphors 214B emitting blue light. For example, red phosphors 214R may be formed of ZnS:Cu,Cl,Mn, green phosphors 214G may be formed of ZnS:Cu,Al, and blue phosphors 214B may be formed of ZnS:Cu,Cl.

Dielectric layer 216 is formed on inorganic light emitting layer 214, and dielectric layer 216 may be formed of, for example, silicon oxide. Second electrode 218 is formed on the dielectric layer 216. Second electrode 218 may be formed of a metal such as silver Ag or a transparent conductive material such as ITO.

Quantum dot layer 230 is formed under substrate 210. Quantum dot layer 230 emits a visible light having a predetermined color(s) by being excited by visible light which is emitted from inorganic light emitting layer 214 and transmits through first electrode 212 and substrate 210. Quantum dot layer 230 may be formed of red quantum dots 230R emitting red light R, green quantum dots 230O emitting green light G, and blue quantum dots 230B emitting blue light B. Red quantum dots 230R, green quantum dots 230G, and blue quantum dots 230B may correspond to red phosphors 214R, green phosphors 214G, and blue phosphors 214B, respectively. Red, green, and blue quantum dots 230R, 230G, and 230B respectively may be excited by visible light having wavelengths in the range of 400 nm to 639 nm to be emitted. Quantum dots 230R, 230G, and 230B may have a size of approximately 1 nm to 100 nm. Red, green, and blue quantum dots 230R, 230G, and 230B respectively can emit visible lights having different colors according to the sizes thereof. For example, red, green, and blue quantum dots 230R, 230G, and 230B respectively may be formed of CdSe/ZnS.

In the above described inorganic electroluminescence device, when a predetermined voltage is applied between first electrode 212 and second electrode 218, electrons are emitted from dielectric layer 216 into inorganic light emitting layer 214. Here, an alternating current may be applied between first electrode 212 and second electrode 218. However, the present invention is not limited to the alternating current but a direct current may also be applied between first electrode 212 and second electrode 218. Next, the electrons emitted from dielectric layer 216 are accelerated in the electric field formed in inorganic light emitting layer 214 and collide with red phosphors 214R, the green phosphors 214G, and blue phosphors 214B respectively inside inorganic light emitting layer 214. Accordingly, red light, green light, and blue light are emitted from red phosphors 214R, green phosphors 214G, and blue phosphors 214B and transmit through first electrode 212 and substrate 210 to excite red quantum dots 230R, green quantum dots 230G, and blue quantum dots 230B respectively. Thus red light R, green light G, and blue light B having high color purity are emitted out from red quantum dots 230R, green quantum dots 230G, and blue quantum dots 230B, thereby forming an image having high color purity.

According to the current embodiment, red phosphors 214R, green phosphors 214G, and blue phosphors 214B correspond to red quantum dots 230R, green quantum dots 230 G, and blue quantum dots 30B, respectively. However, the present invention is not limited thereto, and red phosphors 214R, green phosphors 214G, and blue phosphors 214B may correspond to red quantum dots 230R, green quantum dots 230 G, and blue quantum dots 230B in a variety of ways. For example, red phosphors 214R may correspond to green quantum dots 230G or blue quantum dots 230B. Green phosphors 214G may correspond to red quantum dots 230R or blue quantum dots 230B, and blue phosphors 214B may correspond to red quantum dots 230R or green quantum dots 230G.

Figure 5:
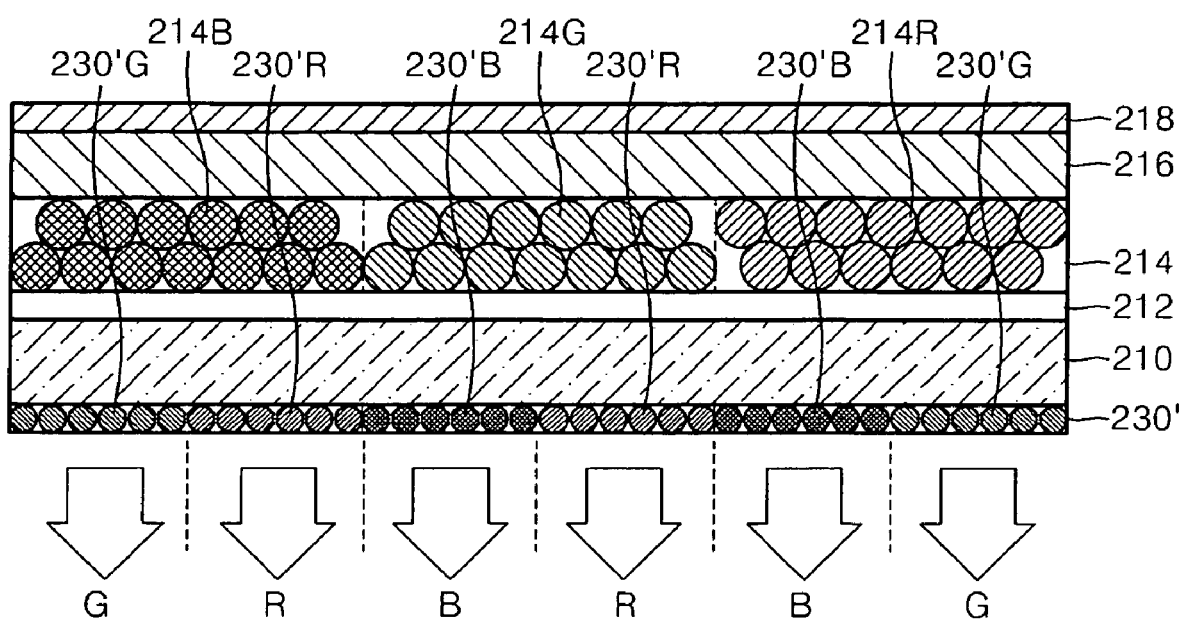
FIG. 5 is a cross-sectional view of a modified example of the inorganic electroluminescence device of FIG. 4.

FIG. 5 is a cross-sectional view of a modified example of inorganic electroluminescence device of FIG. 4. Referring to FIG. 5, unlike FIG. 4, two color types of quantum dots correspond to each color type of phosphor. In detail, green quantum dots 230'G and blue quantum dots 230'B correspond to red phosphors 214R; red quantum dots 230'R and blue quantum dots 230'B correspond to green phosphors 214G; and red quantum dots 230'R and green quantum dots 230'G correspond to blue phosphors 214B.

In the inorganic electroluminescence device described above, green quantum dots 230'G and blue quantum dots 230'B are excited by red light that is emitted from red phosphors 214R and is transmitted through first electrode 212 and substrate 210, and thus green light G and blue light B having high color purity are emitted. Also, red quantum dots 230'R and blue quantum dots 230'B are excited by green light emitted from green phosphors 214G, and thus red light R and blue light B having high color purity are emitted. Also, red quantum dots 230'R and green quantum dots 230'G are excited by blue light emitted from blue phosphors 214B, and thus red light R and green light G having high color purity are emitted. Besides the above examples, two color types of quantum dots may correspond to each color type of phosphor in a variety of other ways. Also, three or more color types of quantum dots may correspond to one color type of phosphor.

As described above, the inorganic electroluminescence device according to the present invention can realize accurate color images by using quantum dots emitting visible light having high color purity and can realize various colors with a widened range of color realization. Accordingly, the inorganic electroluminescence device according to the present invention can be applied not only to backlight units of a keypad of mobile phones or advertising boards but can also be applied to display devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An inorganic electroluminescence device, comprising:
a substrate;
a first electrode formed on the substrate;
an inorganic light emitting layer formed on the first electrode;
a dielectric layer formed on the inorganic light emitting layer;
a second electrode formed on the dielectric layer; and a quantum dot layer that is formed between the first electrode and the inorganic light emitting layer and emits light when excited by a visible light emitted from the inorganic light emitting layer.

2. The inorganic electroluminescence device of claim 1, with the inorganic light emitting layer formed of red phosphors, green phosphors, and blue phosphors, and with the quantum dot layer formed of red quantum dots, green quantum dots, and blue quantum dots.

3. The inorganic electroluminescence device of claim 2, with the quantum dots emitting light by being excited by visible light in a wavelength range of 400 nm-630 nm.

4. The inorganic electroluminescence device of claim 2, with the red, green, and blue phosphors formed to respectively correspond to red, green, and blue quantum dots.

5. The inorganic electroluminescence device of claim 2, with the red phosphors formed to correspond to the green and blue quantum dots, and the green phosphors formed to correspond to the red and blue quantum dots, and the blue phosphors formed to correspond to the red and green quantum dots.

6. The inorganic electroluminescence device of claim 2, with the red phosphors formed of ZnS:Cu,Cl,Mn, the green phosphors are formed of ZnS:Cu,Al, and the blue phosphors formed of ZnS:Cu,Cl.

7. The inorganic electroluminescence device of claim 2, with the quantum dots formed of CdSe/ZnS.

8. The inorganic electroluminescence device of claim 2, with the quantum dots emitting visible lights having different colors according to the size of the quantum dots.

9. The inorganic electroluminescence device of claim 8, with the quantum dots having a size of 1 nm to 100 nm.

10. The inorganic electroluminescence device of claim 1, with the substrate being a transparent glass substrate or a plastic substrate.

11. The inorganic electroluminescence device of claim 1, with the first electrode being formed of a transparent conductive material.

12. The inorganic electroluminescence device of claim 1, with the second electrode being formed of a transparent conductive material or a metal.

13. An inorganic electroluminescence device, comprising:
a substrate;
a first electrode formed on a top surface of the substrate;
an inorganic light emitting layer formed on the first electrode;
a dielectric layer formed on the inorganic light emitting layer;
a second electrode formed on the dielectric layer; and
a quantum dot layer that is formed under the substrate and emits light when excited by visible light emitted from the inorganic light emitting layer.

14. The inorganic electroluminescence device of claim 13, with the inorganic light emitting layer formed of red phosphors, green phosphors, and blue phosphors, and the quantum dot layer formed of red quantum dots, green quantum dots, and blue quantum dots.

15. The inorganic electroluminescence device of claim 14, with the quantum dots emitting light by being excited by visible light in a wavelength range of 400 nm-630 nm.

16. The inorganic electroluminescence device of claim 14, with the red, green, and blue phosphors formed to respectively correspond to red, green, and blue quantum dots.

17. The inorganic electroluminescence device of claim 14, with the red phosphors formed to correspond to the green and blue quantum dots, and the green phosphors formed to correspond to the red and blue quantum dots, and the blue phosphors formed to correspond to the red and green quantum dots.

18. The inorganic electroluminescence device of claim 14, with the red phosphors formed of ZnS:Cu,Cl,Mn, the green phosphors formed of ZnS:Cu,Al, and the blue phosphors formed of ZnS:Cu,Cl.

19. The inorganic electroluminescence device of claim 14, with the quantum dots formed of CdSe/ZnS.

20. The inorganic electroluminescence device of claim 14, with the quantum dots emitting visible light having different colors according to the size of the quantum dots.

21. The inorganic electroluminescence device of claim 20, with the quantum dots have a size of 1 nm to 100 nm.

22. The inorganic electroluminescence device of claim 13, with the substrate being a transparent glass substrate or a plastic substrate.

23. The inorganic electroluminescence device of claim 13, with the first electrode being formed of a transparent conductive material.

24. The inorganic electroluminescence device of claim 13, with the second electrode being formed of a transparent conductive material or a metal.

25. An inorganic electroluminescence device, comprising:
a substrate;
a first electrode formed on the substrate;
an inorganic light emitting layer formed on the first electrode;
a dielectric layer formed on the inorganic light emitting layer;
a second electrode formed on the dielectric layer; and
a quantum dot layer emitting light by being excited by a visible light emitted from the inorganic light emitting layer.

* * * * *